(12) United States Patent
Le Grand de Mercey et al.

(10) Patent No.: US 6,812,819 B2
(45) Date of Patent: Nov. 2, 2004

(54) INDUCTIVE ELEMENT OF AN INTEGRATED CIRCUIT

(75) Inventors: Grégoire Le Grand de Mercey, München (DE); Christophe Holuigue, München (DE)

(73) Assignee: Xignal Technologies AG, Unterhaching (DE)

( * ) Notice: Subject to any disclaimer, the term of this patent is extended or adjusted under 35 U.S.C. 154(b) by 0 days.

(21) Appl. No.: 10/435,039

(22) Filed: May 12, 2003

(65) Prior Publication Data

US 2003/0214380 A1 Nov. 20, 2003

(30) Foreign Application Priority Data

May 15, 2002 (DE) .......................................... 102 21 442

(51) Int. Cl.$^7$ ................................................ H01F 5/00
(52) U.S. Cl. ........................ 336/200; 336/223; 336/232
(58) Field of Search ................................ 336/223, 232, 336/200

(56) References Cited

U.S. PATENT DOCUMENTS 6,144,276 A * 11/2000 Booth .......................... 336/61
2002/0063585 A1   5/2002 Butaye et al.

FOREIGN PATENT DOCUMENTS

| DE | 1 095 403    | 10/1964 |
| DE | 690 31 501 T2 | 9/1997 |
| DE | 198 55 008 A1 | 5/2000 |
| EP | 0 590 738 B1 | 9/1997 |
| EP | 1 168 442 A2 | 1/2002 |
| WO | WO 00/31778 A1 | 6/2000 |
| WO | WO 00/57437 A1 | 9/2000 |

OTHER PUBLICATIONS

Walker C. S. "Capacitance, Inductance, and Crosstalk Analysis", British Library Cataloguing in Publication Date, 1990, ISBN 0–89006–392–3, p. 95.

Tang, C. C. et al., "Minature 3–D Inductors in Standard CMOS Process", IEEE Journal of Solid–State Circuits, 2002, vol. 37, No. 4, pp. 471–480.

* cited by examiner

*Primary Examiner*—Anh Mai
(74) *Attorney, Agent, or Firm*—Rothwell, Figg, Ernst & Manbeck, P.C.

(57) ABSTRACT

An inductive element (10) of an integrated circuit, comprising at least one turn (12), which is formed by an integrated elongated track (14) made of a conductive material, wherein the interior margin of the conductive track (14) comprises at least one recess (30). The invention makes it possible in particular to increase the inductivity of the element (10) in a given available space on the substrate of an integrated circuit.

11 Claims, 4 Drawing Sheets

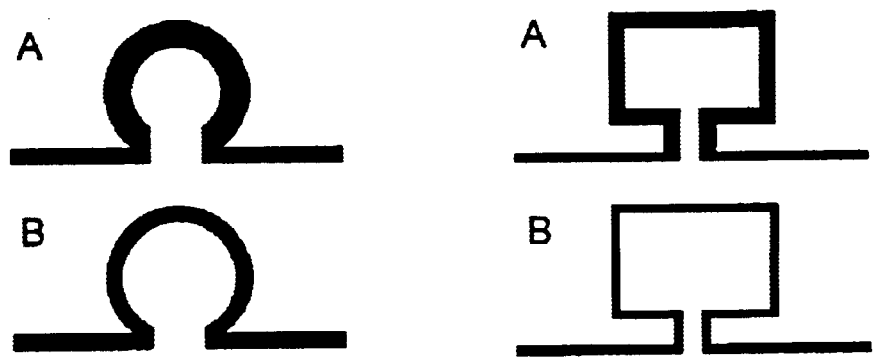
Fig. 1 State of the art
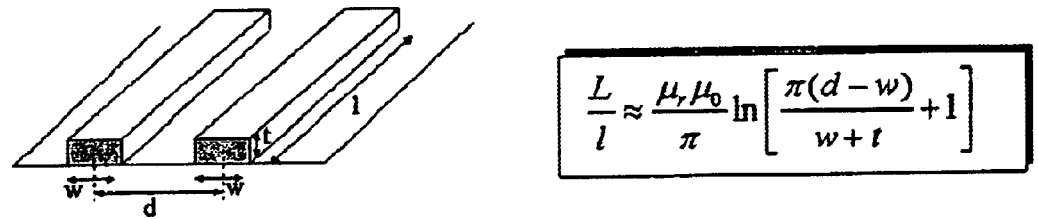
Fig. 2
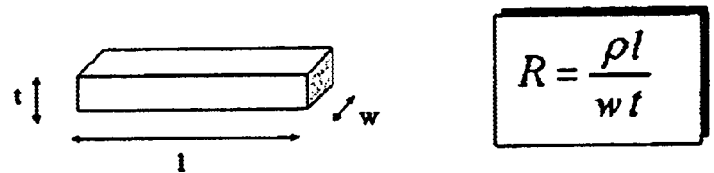
Fig. 3

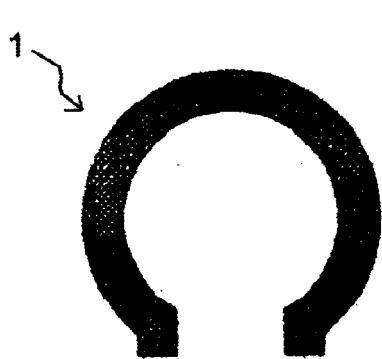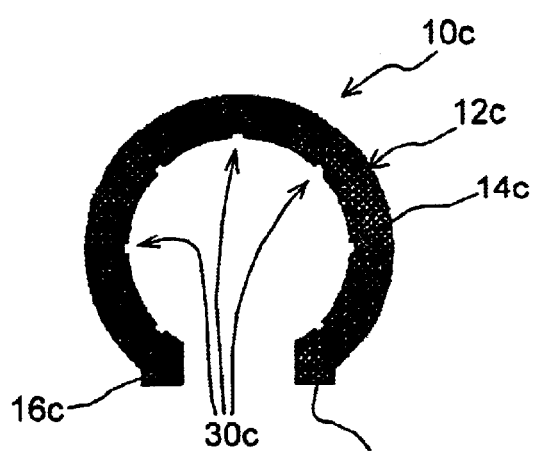
Fig. 9    Fig. 10
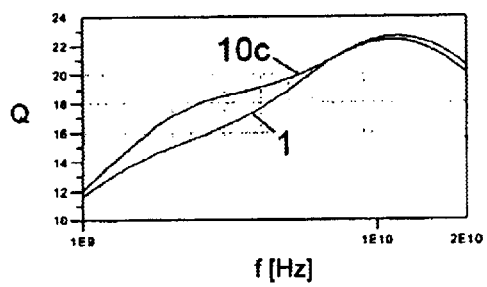
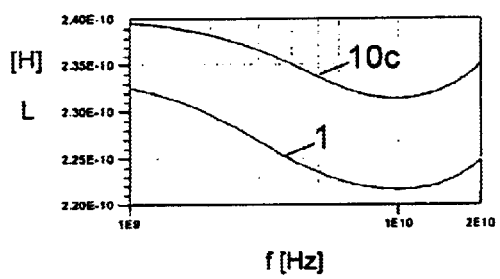
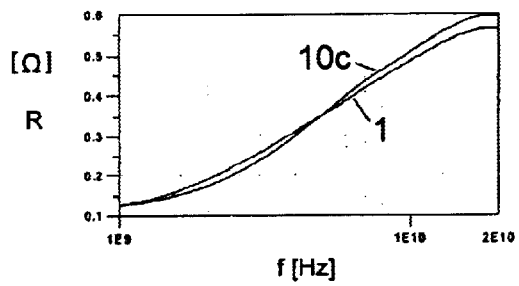
Fig. 11

INDUCTIVE ELEMENT OF AN INTEGRATED CIRCUIT

BACKGROUND TO THE INVENTION

1. Field of the Invention

The present invention relates to integrated circuits and in particular to an inductive element of an integrated circuit, comprising at least one turn, which is formed by an integrated elongated track made of a conductive material.

2. Description of the State of the Art

Such elements are known in particular from the field of integrated high-frequency circuits where they are also known as "integrated coils" or "monolithic coils". Such coils can be made using any of the usual production technologies applying to integrated circuits. Advantageously, in such production of coils on or in a substrate of an integrated high-frequency circuit, instances of undesirably large electrical and magnetic coupling can be avoided, as they would necessarily occur with the use of external coils, for example in the field of contact pads and bond lines.

Inductivity and electrical resistance are important parameters of an inductive element. Together with the electrical characteristics of the direct surroundings of the element, the ratio of these two parameters determines the so-called quality, or quality factor, as well as the resonance frequency of the element or of a resonating circuit based on such an element. Space requirement is a further important parameter of an integrated inductive element.

Although these parameters greatly depend on the layout and the characteristics of the production technology used, relatively narrow boundaries always exist in relation to these parameters in the design of an integrated inductive element. Often, the element is associated with considerable resistance, because the width of the conductive track is limited by the space available, on a semiconductor substrate, for the element, and because the height of the conductive track is limited by the production technology used. For a given available space, the maximum achievable inductivity is considerably limited, in particular because in the case of an integrated circuit the arrangement of a multitude of turns (ring-shaped conductor sections) essentially has to be in two dimensions (e.g. in one plane of the layout). If the resistance of the conductive track is not to be excessive, only a few turns can be accommodated in a given surface area.

In summary, in the design of integrated inductive elements, there are conflicting objectives concerning the important parameters. The implementation of such an element which has modest space requirements, low resistance and high inductivity poses particular problems.

SUMMARY OF THE INVENTION

It is thus the object of the present invention to provide an inductive element of an integrated circuit of the type mentioned in the introduction in which there is greater freedom in selecting the parameters.

This object is met by an inductive element comprising at least one recess. The dependent claims relate to advantageous improvements of the invention, which may of course be combined with one another.

The invention provides for the interior margin of the conductive track of the inductive element to comprise at least one recess. In this way, it is possible, for example with a predetermined space requirement and a predetermined resistance, to increase the inductivity; or with a predetermined resistance and a predetermined inductivity, to save space. Irrespective of this, there is a reduction in the capacitive coupling to the substrate.

The element can be implemented using various production technologies (CMOS, bipolar, BICMOS, GaAS, etc.). In order to provide an element with low resistance, the material of the conductive track can be a metal. As an alternative, heavily doped semiconductor material or polysilicon can also be considered.

Preferably, the arrangement of the conductive track is essentially polygonal (e.g. rectangular) or circular in shape. With a predetermined inductivity and width of the conductive track, particularly low resistance can be achieved with a circular arrangement of the conductive track.

In a preferred embodiment, the conductive track is arranged along at least 80% of the circumference in the shape of a rectangle or a circle. For high-frequency circuits featuring high integration density, which circuits are of particular interest in the context of this invention, a uniform width of the conductive track or a local maximum width of the conductive track is less than 100 μm, in particular less than 50 μm. If the inductive element comprises only one turn, then the ratio of width of the conductive track (averaged over the length of the conductive track) to maximum transverse extension of the turn preferably ranges between 0.01 and 0.4.

Preferably, the conductive track (apart from its recesses) is of essentially uniform width, in particular a width which along the entire length of the conductive track at most deviates by 20% from the average width of the conductive track. The improvement in the characteristics of the element is particularly good if the extent of the recess in transverse direction of the conductive track is in the range of 0.1 times to 0.5 times the width of the conductive track, and/or if the extent of the recess in longitudinal direction of the conductive track is in the range of 0.05 times to 0.5 times the width of the conductive track.

The extent of a recess in longitudinal direction of the conductive track should be selected at least so that during operation of the inductive element with electrical loads according to the specifications of this element, no breakdown due to excessive electrical field strength occurs in the region of the recess. To prevent breakdown, a preferred embodiment provides for the use of a material in the area of the recess, which material differs from the substrate material of the integrated circuit and provides better breakdown strength than does said substrate material. For example, the inductive element can be formed in the uppermost conductor plane of an IC, which is covered by an insulating passivation layer, which also extends into the recesses.

Generally speaking, particularly good characteristics of the element can also be achieved if the interior margin of the conductive track comprises several recesses (e.g. notches) which in longitudinal direction of the conductive track are essentially evenly spaced apart. In this arrangement it has been shown to be advantageous if the sum of the extent of the recesses in longitudinal direction of the conductive track ranges from 0.05 times to 0.2 times the length of the conductive track.

In particular, if the width of the conductive track in the region of a recess is relatively small, e.g. within the magnitude of the structural width which can be achieved with the production technologies in use, a recess of rectangular shape is advantageous. With regard to the electrical characteristics of the element, a recess in the shape of an indentation with a curved indentation margin is favourable, e.g. a semicircular indentation.

Preferably, the ratio of the recess area to the area of the conductive track (with an imaginary continuation of the conductive track in the region of the recesses) ranges from 0.005 to 0.25.

BRIEF DESCRIPTION OF THE DRAWINGS

Below, the invention is described in more detail by means of exemplary embodiments with reference to the enclosed drawings. The following are shown:

FIG. 1 four embodiments of an inductive element according to the state of the art, to illustrate the interrelationship between inductivity, resistance, and width of the conductive track, of a conductive track of uniform width;

FIG. 2 an illustration to explain the self-inductance of two parallel flat conductors;

FIG. 3 an illustration to explain the resistance of a flat conductor;

FIG. 9 an inductive element according to the state of the art, as a comparison example;

FIG. 10 a further inductive element according to the invention;

FIG. 11 comparative illustrations of the quality, inductivity and resistance, each depending on the frequency of the two elements according to FIGS. 9 and 10.

DESCRIPTION OF THE PREFERRED EMBODIMENTS

With reference to FIGS. 1 to 5, first, the basic dependence of the electrical characteristics of an integrated inductive element on its geometric design is explained.

FIG. 1 shows two elements, designated A, which are formed by a curved conductive track of uniform width, of an essentially circular arrangement (left) and an essentially rectangular arrangement (right). Shown in the lower half of FIG. 1 and designated B are corresponding elements with the same space requirements but with reduced width of the conductive track. The contexts shown below in FIGS. 2 and 3 are useful for comparing the inductivity and the resistance of structures A with those of the corresponding structures B.

The left of FIG. 2 shows the arrangement of two parallel flat conductors with an inductivity L in relation to the length l of the flat conductors, with said inductivity L being given by the approximation formula shown on the right of the figure. $\mu r$ designates the relative permeability of the surroundings of the flat conductor (by approximation 1); $\mu 0$ designates the absolute permeability of the vacuum; d the mutual distance between the flat conductors; w the width of the flat conductors; and t the height of the flat conductors. The dependence of the inductivity on the width w and the length l according to this approximation similarly also applies to the structures shown in FIG. 1. In relation to the structures A, B shown on the left in FIG. 1, this approximation applies if the distance d is replaced by the diameter of the arc-shaped conductor section, wherein the arithmetic mean of the interior diameter and exterior diameter is to be used as the diameter.

In the structures A shown in FIG. 1, the inductivity can thus be increased by reducing the width w of the conductive track, or by increasing the length l of the conductive track. This is the case in the structures designated B in FIG. 1. Thus, with an identical space requirement, the inductivity of the structures B is greater than that of the corresponding structures A.

The left of FIG. 3 shows a flat conductor of a length l, a width w and a height t, while the right of this figure shows the dependence of the electrical resistance R of this conductive track on these dimensions and on the specific resistance p (homogeneous material).

In the structures designated B in FIG. 1, the length l of the conductive track is increased and the width w of the conductive track is decreased when compared with those of the corresponding structures A. Thus, the resistance R of the structures B is comparatively high.

Practical application always necessitates a compromise, in the structures shown in FIG. 1, between the necessary inductivity, the quality and the space requirement. A structure with high inductivity L but nevertheless low resistance R often requires too much space.

Figure 4:
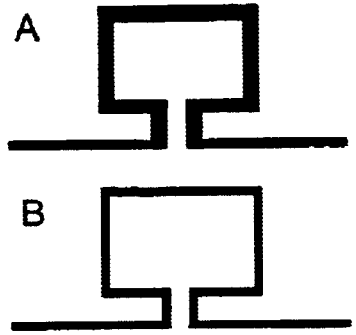
FIG. 4 two embodiments of an inductive element according to the state of the art for detailed explanation of the influence that the width of the conductive track has on the characteristics of the element.
Figure 5:
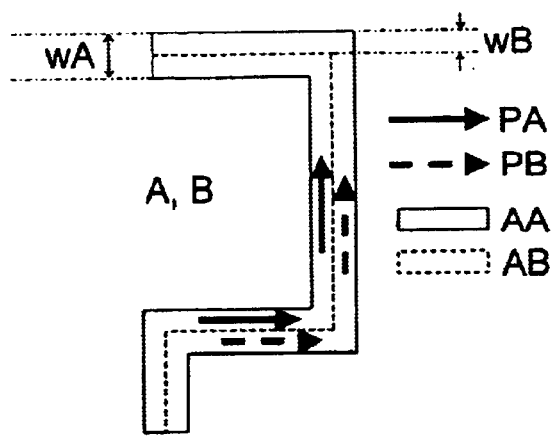
FIG. 5 an illustration for explaining the space requirement as well as the current paths in the inductive elements according to FIG. 4.

FIG. 4 again shows the rectangular structures A, B shown on the right in FIG. 1; while FIG. 5 is a combined illustration of part of a turn formed by the conductive track showing the different widths wA, wB of the conductive tracks; the different areas AA, BB of the conductive tracks; and the different preferred current paths PA, PB. The substrate space requirement of the structures A and B is identical. The width wA of the conductor path of structure A is greater than that of structure B; the resistance of structure A is thus lower than that of structure B. However, due to the lesser width wB of the conductive track and the larger distance between conductive tracks, the inductivity of structure B is greater than that of structure A. Neither structure A nor B thus makes it possible to achieve good inductivity with small resistance and at the same time with the least possible space requirement.

Figure 6:
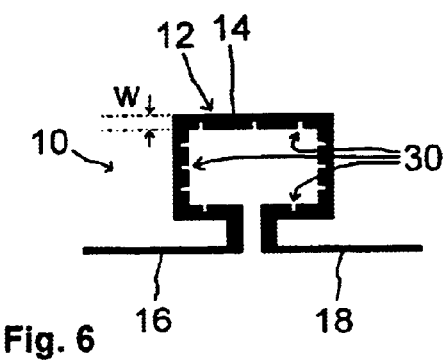
FIG. 6 an illustration of an inductive element according to the invention.

FIG. 6 shows an inductive element 10 according to the invention, comprising a turn 12 which is formed from a ring-shaped conductive track 14 of uniform width w. The element 10 has been formed in a conductive plane within the context of IC production and is connected by way of contacts 16, 18 to further components (not shown) of an integrated circuit. At its inside, the conductive track 14 comprises a multitude of recesses or notches 30.

The space requirement of the element 10 shown is the same as that of the elements A and B shown in FIG. 4. However, due to its recesses 30, element 10 has improved characteristics when compared to elements A and B. In a way, structure 10 combines the advantage of low resistance of structure A with the advantage of good inductivity of structure B. The recesses 30 result in the current flowing through the conductive track having to use an effectively longer current path, so that an increase in inductivity results. At the same time, however, the recesses 30 only cause a slight increase in the resistance because this resistance results from integration of a local, specific resistance, with local increases of this specific resistance, which increases are caused in the region of the recesses 30, contributing relatively little to the integral. Rather, in the example shown in FIG. 6, resistance results which approximately corresponds to that of structure A in FIG. 4, because when seen in longitudinal direction (circumferential direction), the non-recessed sections of the conductive track predominate by far.

In the following description of further embodiments, the same reference numbers are used for analogous components, in each case supplemented by a small letter for the purpose of differentiating the embodiment. The description essentially only deals with differences in relation to the already described embodiment(s). For the remainder, we expressly refer to the description of the above embodiments.

Figure 7:
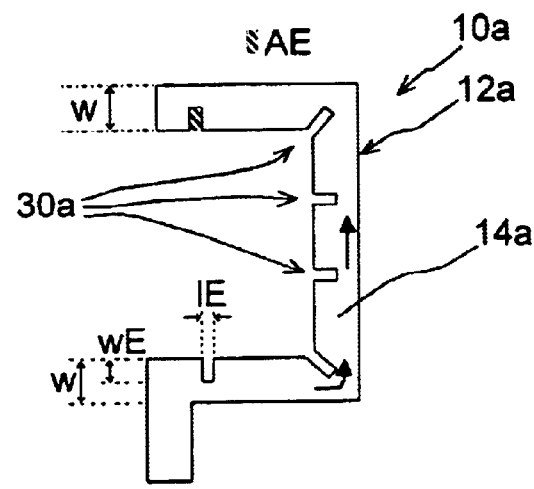
FIG. 7 an illustration which corresponds to that shown in FIG. 5, to explain the current path in an inductive element according to the invention.

FIG. 7 shows an illustration, which corresponds to that of FIG. 5, of part of an inductive element 10a comprising a turn 12a which is formed by a conductive track 14a. The conductive track 14a is again arranged so as to follow a rectangle. In the embodiment according to FIG. 7 some recesses 30a are provided at the corner regions of the conductive track 14a, this arrangement being different from the embodiment shown in FIG. 6. As is the case in the element according to FIG. 6, the recesses 30a are rectangular in shape. Their width is designated wE, their length lE, and their area AE. A comparison with FIG. 5 shows that the current path approximately corresponds to the current path PB so that a high degree of inductivity is achieved. In the turn section shown, the area of the conductive track is reduced by 6×AE. Furthermore, this reduction in area advantageously reduces the capacitive coupling of the conductive track to the substrate (when compared e.g. with structure A in FIG. 4).

Figure 8:
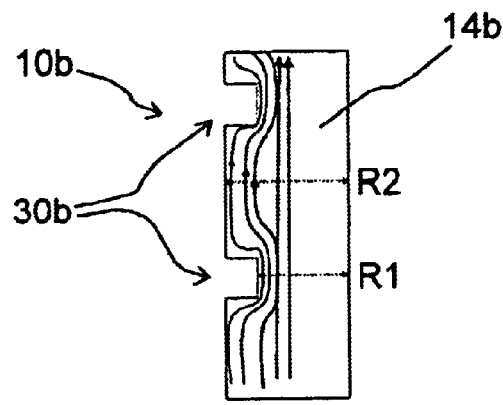
FIG. 8 an illustration similar to that in FIG. 7, to explain the current density distribution in a further inductive element according to the invention.

FIG. 8 shows an illustration, similar to that in FIG. 7, of a section of a conductive track 14b to form an inductive element 10b. Current flow paths in the region of two subsequently arranged recesses 30b are shown in the drawing. This shows that the length of an "effective current path" which is decisive for the inductivity of the element 10b is extended by the arrangement of the recesses 30b. The current flow occurs around the recesses 30b.

FIGS. 9 to 11 provide a comparison between a conventional inductive element 1 (FIG. 9) and an inductive element 10c (FIG. 10) according to the invention. The element 10c only differs from the conventional element 1 by an equidistant arrangement of seven rectangular recesses 30c on the interior margin of the conductive track 14 which describes a ring-shaped curve. From the point of view of electrical characteristics, preferably an odd number of recesses is provided for a turn (for reasons of symmetry). Thus, the example shown provides for seven recesses of the same design and dimensions.

FIG. 11 shows the frequency dependence of the quality Q, of the inductivity L and of the resistance R for both elements 1 and 10c. The graphs shown in FIG. 11 are the result of simulation of the elements 1, 10c, with a much simplified equivalent circuit comprising an inductivity L, an ohmic resistance R arranged in series to it, and a parasitic capacity C to the substrate (not shown). This considerable simplification within the scope of simulation results in the frequency dependence of the simulated values Q, L and R.

FIG. 11 shows that the quality Q of element 10c, when compared to that of element 1, for example at a design frequency of 10 GHz, is almost unchanged, while the resistance R is only slightly higher, and the inductivity L is considerably higher.

Figure 12:
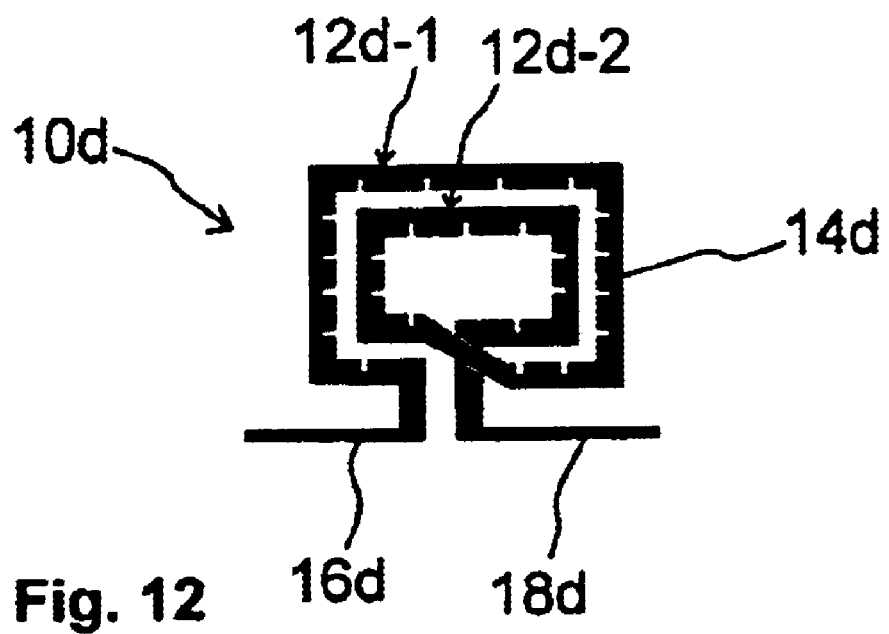
FIG. 12 a further inductive element according to the invention comprising several turns.

FIG. 12 shows a further embodiment of an inductive element 10d, comprising two turns 12d-1 and 12d-2, each of which is formed by a section of a spiral-shaped conductive track 14d. Still further turns could be provided, an arrangement which is different from that in the embodiment shown. Furthermore, it is possible to provide recesses only in part of a multitude of turns.

What is claimed is:

1. An inductive element (10) of an integrated circuit, comprising at least one turn (12), which is formed by an integrated elongated track (14) made of a conductive material, wherein the interior margin of the conductive track (14) comprises at least one recess (30).

2. The element according to claim 1, wherein the material of the conductive track (14) is a metal.

3. The element according to claim 1, wherein the arrangement of the conductive track (14) is essentially polygonal or circular in shape.

4. The element according to claim 1, wherein the width (w) of the conductive track (14) is essentially uniform.

5. The element according to claim 4, wherein the extent of the recess (30) in transverse direction of the conductive track is in the range of between 0.1 times to 0.5 times the width (w) of the conductive track.

6. The element according to claim 4, wherein the extent of the recess (30) in longitudinal direction of the conductive track (14) is in the range of 0.05 times to 0.5 times the width (w) of the conductive track.

7. The element according to claim 1, wherein the interior margin of the conductive track (14) comprises several recesses (30) which in longitudinal direction of the conductive track are essentially evenly spaced apart.

8. The element according to claim 7, wherein the sum of the extent of the recesses (30) in longitudinal direction of the conductive track (14) ranges from 0.05 times to 0.2 times the length (l) of the conductive track.

9. The element according to claim 1, wherein the recess (30) is essentially rectangular or semicircular in shape.

10. The element according to claim 1, wherein the ratio of the recess area to the area of the conductive track ranges from 0.005 to 0.25.

11. An integrated circuit, comprising at least one inductive element (10) according to claim 1.

* * * * *